United States Patent [19]

Hoshi et al.

[11] Patent Number: 5,043,728
[45] Date of Patent: Aug. 27, 1991

[54] PREDICTIVE CODING DEVICE AND PREDICTIVE DECODING DEVICE

[75] Inventors: Nobuhiro Hoshi; Toshihiro Yagisawa; Hisashi Ishikawa, all of Yokohama, Japan

[73] Assignee: Canon Kabushiki Kaisha, Tokyo, Japan

[21] Appl. No.: 430,006

[22] Filed: Nov. 1, 1989

[30] Foreign Application Priority Data

Nov. 2, 1988 [JP] Japan .................................. 63-277642
Nov. 5, 1988 [JP] Japan .................................. 63-280125

[51] Int. Cl.$^5$ ............................................. H03M 7/34
[52] U.S. Cl. ...................................... 341/106; 341/76; 341/51
[58] Field of Search ..................... 341/51, 76, 77, 106; 375/27, 28

[56] References Cited

U.S. PATENT DOCUMENTS

| | | | |
|---|---|---|---|
| 3,860,908 | 1/1975 | Stratton, III | 341/106 |
| 4,540,973 | 9/1985 | Grallert | 341/76 |
| 4,797,653 | 1/1989 | Takayama | 341/51 |
| 4,852,125 | 7/1989 | Suzuki | 341/76 |
| 4,903,124 | 2/1990 | Hoshi et al. | 358/133 |

*Primary Examiner*—A. D. Pellinen
*Assistant Examiner*—Marc S. Hoff
*Attorney, Agent, or Firm*—Fitzpatrick, Cella, Harper & Scinto

[57] ABSTRACT

A predictive coding device wherein a coding means for coding a difference between a sample value and a corresponding predictive value and outputting a coded code includes a memory storing at least one look-up table. The coding characteristics of the coded code can be changed, and at the same time, a control code associated with the coding characteristics is transmitted together with the coded code.

16 Claims, 9 Drawing Sheets

FIG.9A

| SYNC. DATA | ID DATA | DPCM CODE |
|---|---|---|

FIG.9B

| SYNC. DATA | ID DATA | TABLE DATA |
|---|---|---|

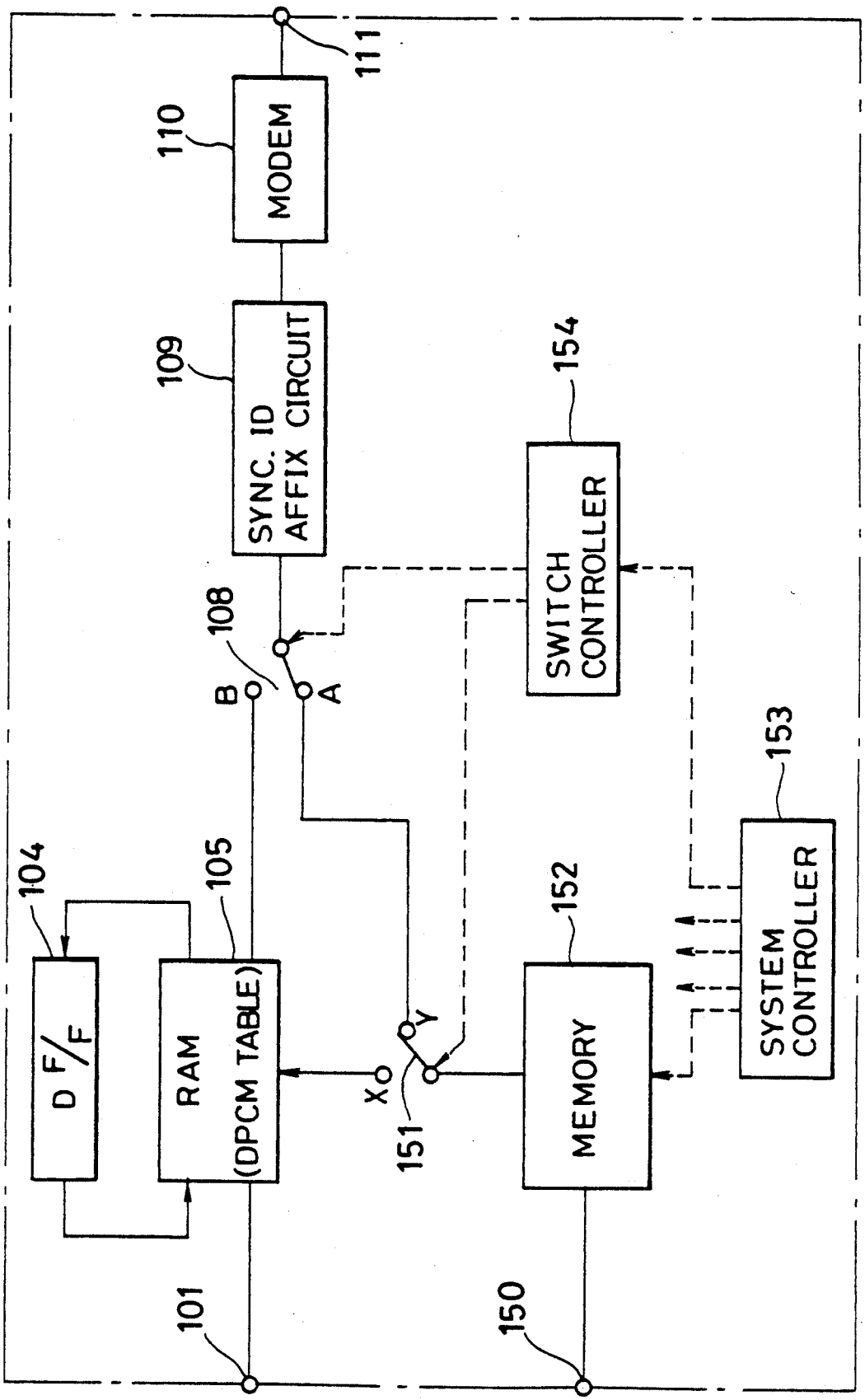

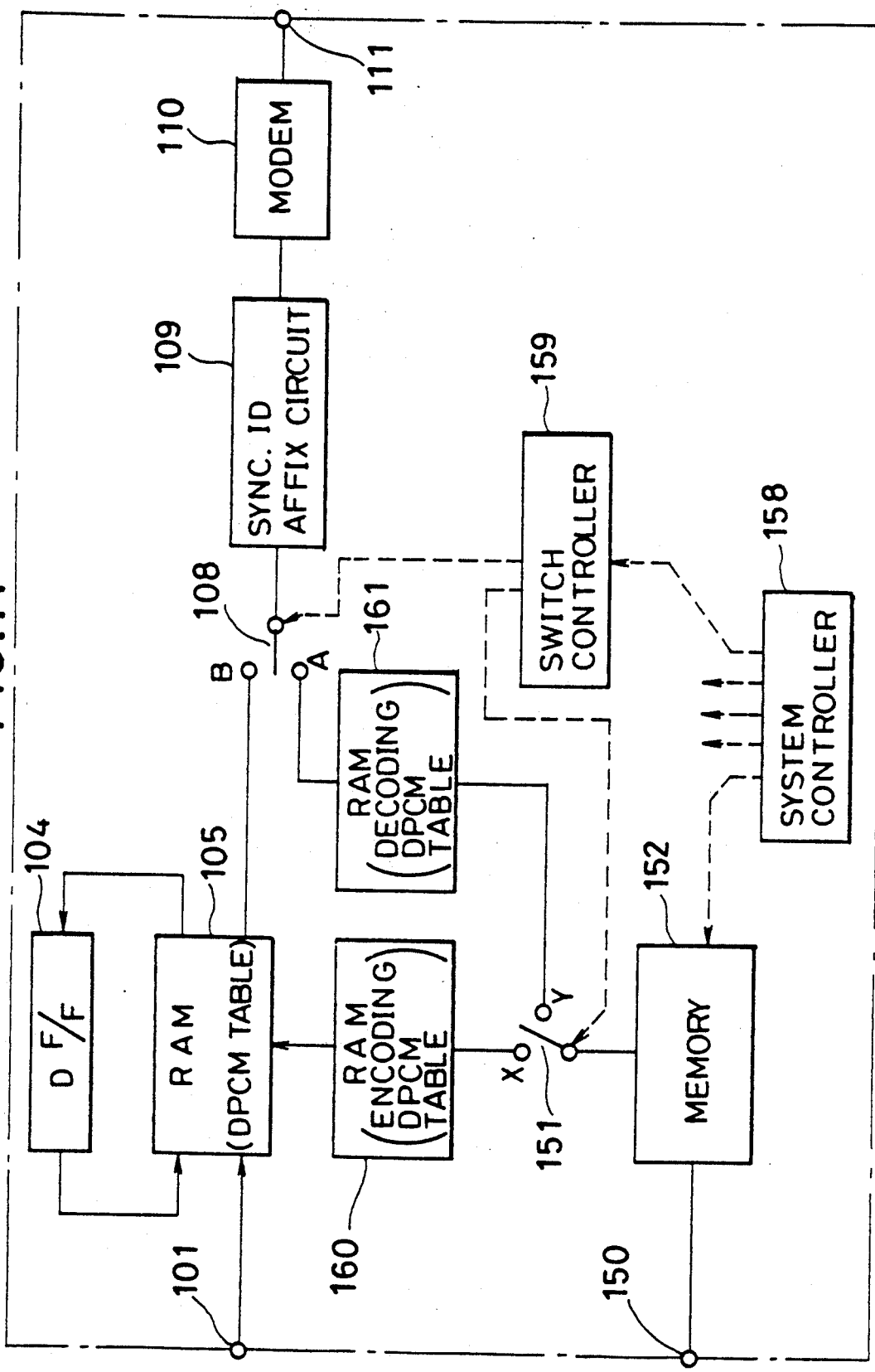

PREDICTIVE CODING DEVICE AND PREDICTIVE DECODING DEVICE

BACKGROUND OF THE INVENTION

1. Field of the Invention

The present invention relates to predictive coding and decoding devices and, more particularly, to coding and decoding devices in a system for transmitting a so-called predictive coded code.

2. Related Background Art

Various coding schemes have been proposed to reduce the volume of transmission data when information such as image and audio data is transmitted in the form of a digital signal. One of the coding schemes is a differential pulse-code modulation (to be referred to as a DPCM hereinafter) for compressing information by using a correlation between adjacent sample values. According to DPCM, as is well-known, a coded sample value is temporarily decoded, a predictive value for a sample to be coded next is obtained by using the decoded value, and the between this predictive value and an actual sample value is quantized to perform coding.

FIG. 1 is block diagram showing the simplest arrangement of a DPCM coding device for performing prediction using a previous value. A sample value Xi input to an input terminal 1 is applied to a subtracter 2 to subtract a predictive value (a previous decoded value in this case) to be described later. A difference value output from the subtracter 2 is quantized by a quantizer 3. The quantized value is output to an output terminal 8 as a DPCM code Yi. The DPCM code Yi is also applied to an inverse quantizer 4. The inverse quantizer 4 decodes the DPCM code Yi into a difference value, and the difference value is applied to an adder 5. The adder 5 adds the previous predictive value applied to the subtracter 2, thereby restoring the difference value as the original sample value. A limiter 6 limits the amplitude of an output from the adder 5 into a predetermined range, and an output from the limiter 6 is supplied to a D flip-flop 7. An output from the D flip-flop 7 serves as a predictive value of the next sample value. This value is supplied to the adder 5.

Small differences are normally concentrated in a distribution of difference values between the previous predictive values and the corresponding actual sample values. The difference value is coded and transmitted to achieve data compression transmission.

In order to increase the processing speed of the above predictive coding apparatus and simplify the circuit arrangement, the present applicant proposed to arrange all of the main part of the predictive coding device by look-up tables (U.S. application Ser. No. 288,994).

FIG. 2 is a block diagram showing an arrangement of a DPCM coding device whose main part is constituted by a ROM (Read-Only Memory). The circuit arrangement in FIG. 2 includes an input terminal 40 for a sample value Xi, a ROM 41 having a table for storing a predictive coded code Yi and a decoded value $\overline{Xi}$, a D flip-flop 44 for converting the decoded value $\overline{Xi}$ (local decoded value) output from the ROM 41 into a previous predictive value $\hat{X}i$, a sync affix circuit 42 for adding sync data and identification (ID) data to a DPCM code output from the ROM 41, and an output terminal 43 for outputting a data string added with the DPCM code, sync data, and ID data.

The input sample value Xi (8 bits) from the input terminal 40 and the 8-bit predictive value $\hat{X}i$ output from the D flip-flop 44 are supplied to address inputs of the ROM 41. More specifically, the 8-bit input sample value Xi and the 8-bit predictive value $\hat{X}i$ serve as a 16-bit address input to the ROM 41. The ROM 41 initially stores a local coded value and a DPCM code as a combination of the input value Xi and the predictive value $\hat{X}i$. The DPCM code is supplied to the sync affix circuit 42, and the local decoded value is supplied to the D flip-flop 44. That is, the ROM 44 in FIG. 5 performs the processing corresponding to a portion 9 in FIG. 1.

FIG. 3 is a block diagram of an arrangement of a decoding device corresponding to the coding device shown in FIG. 2. This circuit arrangement includes an input terminal 50 for receiving the DPCM code, the sync information, and the ID code, a sync separation circuit 52 for separating the DPCM code from the sync and ID data, a ROM 51 for receiving a DPCM code Yi (e.g., 4 bits) and a predictive value (previous decoded value) $\hat{X}i$ (to be described later) as address signals and outputting a decoded value $\overline{Xi}$, and a D flip-flop 54 for converting the decoded value $\overline{Xi}$ output from the ROM 51 into the predictive value $\hat{X}i$.

The table of the ROM 51 is determined in correspondence with the table of the transmitting ROM 41. That is, the ROM 51 performs the processing corresponding to a portion 9a of FIG. 1. The sync data and the ID data separated by the sync separation circuit 52 are supplied to a control circuit 55, and the control circuit 55 controls the timings of the overall system.

With the arrangements of the coding and decoding devices described above, high-speed DPCM processing can be performed, and hardware can also be simplified.

The DPCM coding and decoding processing have different optimal processing characteristics in accordance with characteristics of data to be coded, which data are exemplified by image and audio data. Different processing characteristics must often be used in one image or one dynamic image program. In this manner, when data having different characteristics are to be processed, the coding device (FIG. 2) and the decoding device (FIG. 3) are not often suitable for the DPCM processing characteristics. In this case, quantization noise and the like are undesirably increased. Thus, there is much room for improvement in the coding and decoding devices in terms of adaptability for coded information.

SUMMARY OF THE INVENTION

It is an object of the present invention to provide a coding device having a simple hardware configuration, capable of high-speed processing, and having excellent adaptability.

In order to achieve the above object, according to an aspect of the present invention, there is provided a predictive coding device, comprising:

(a) coding means for coding the difference between a sample value and a corresponding predictive value and outputting a coded code and a local decoded value, the coding means including at least one look-up table whose coding characteristics can be changed;

(b) means for generating a control code associated with the coding characteristics of the coding means;

(c) predictive means for forming the predictive value using the local decoded value; and (d) means for transmitting the coded code and the control code.

It is another object of the present invention to obtain excellent adaptability of a coding device without using a large means for transmitting a control code.

In order to achieve the above object, according to another aspect of the present invention, there is provided a predictive coding device, comprising:
(a) means for coding the difference between a sample value and a corresponding predictive value and outputting a coded code and a local decoded value, the coding means being arranged to change the coding characteristics thereof;
(b) means for generating a control code associated with the coding characteristics of the coding means;
(c) predictive means for forming the predictive value by using the local decoded value; and
(d) means for multiplexing the coded code, sync data, and the control code along a time axis and transmitting the multiplexed data, the transmitting means being arranged to transmit the data in units of sync blocks each including the sync data at a start thereof, the coded code, and the control code.

The above and other objects, features and advantages of the present invention will be apparent from the detailed description of preferred embodiments in conjunction with the accompanying drawings.

BRIEF DESCRIPTION OF THE DRAWINGS

FIGS. 9A and 9B are diagrams showing the data formats of a data string output from the coding device shown in FIG. 7;

FIG. 10 is a block diagram showing an arrangement of a coding device according to still another embodiment of the present invention; and FIG. 11 is a block diagram showing an arrangement of a coding device according to still another embodiment of the present invention.

DETAILED DESCRIPTION OF THE PREFERRED EMBODIMENTS

Preferred embodiments of the present invention will be described with reference to the accompanying drawings.

Figure 4:
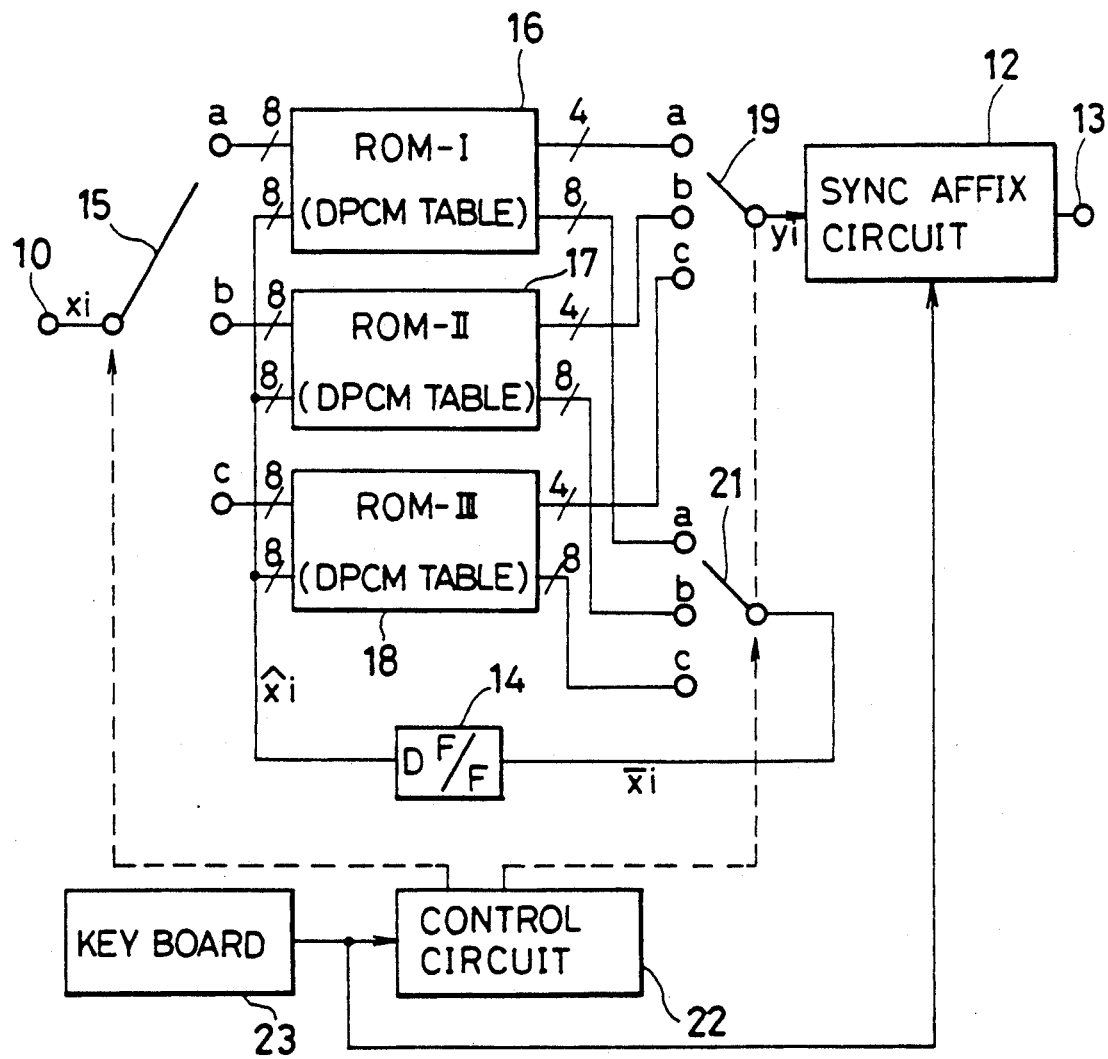
FIG. 4 is a block diagram showing an arrangement of a coding device according to an embodiment of the present invention.

FIG. 4 is a block diagram showing an arrangement of a coding device according to an embodiment of the present invention. The coding device includes an input terminal 10 for receiving an 8-bit sample value Xi, a sync affix circuit 12 for adding sync data and ID data to a coded code, an output terminal 13 for outputting a coded data sequence, a switch 15 for selecting a DPCM table (to be described later), ROMs (ROM-I, ROM-II, and ROM-III) 16, 17, and 18 serving as DPCM tables for storing different quantization characteristics, a D flip-flop 14 for converting a local decoded value $\overline{X}i$ into a predictive value $\hat{X}i$ of the next sample value, a switch 19 for selecting one of the predictive coded codes output from the ROM-I 16, the ROM-II 17, and the ROM-III 18, a switch 21 for selecting one of the local decoded values output from the ROM-I 16, the ROM-II 17, and the ROM-III 18, a control circuit 22 for controlling the switches 15, 19, and 21, and a keyboard 23 which can be arbitrarily operated to select one of the DPCM tables.

An operator (user) designates with the keyboard 23 the best coding processing using one of the three DPCM tables (ROM-I, ROM-II, and ROM-III) in accordance with the characteristics of information to be input and transmitted. Output data from the keyboard 23 is input to the control circuit 22 and the sync affix circuit 12.

The control circuit 22 controls the switches 15, 19, and 21 so that one of the three DPCM tables is loaded in the circuit on the basis of the data from the keyboard 23. For example, when the ROM-I 16 is selected as a DPCM table, the switch 15 is connected to the a terminal so that the 8-bit sample value Xi serves as an address input to the ROM-I 16. The switch 19 is connected to the a terminal so that the 4-bit DPCM code output from the ROM-I 16 is supplied to the sync affix circuit 12. In addition, the switch 21 is connected to the a terminal so that the 8-bit local decoded value output from the ROM-I 16 is input to the D flip-flop 14.

Figure 1:
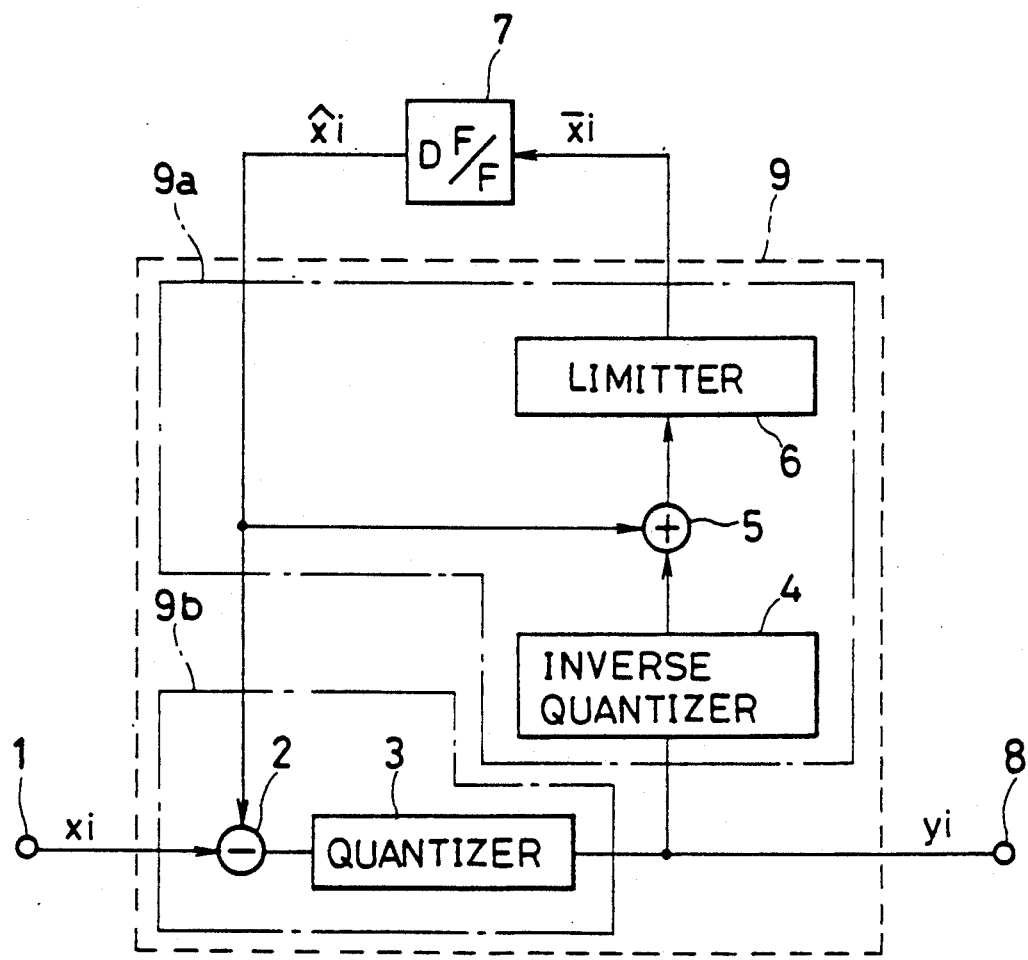
FIG. 1 is a block diagram of a conventional pre-stage predictive coding device.

The ROM-I 16, the ROM-II 17, and the ROM-III 18 have the same function as the portion 9 indicated in FIG. 1. The characteristics of the quantizer 3 and the inverse quantizer 4 are changed depending on the characteristics of the ROMs. Upon operation of the switches 15, 19, and 21, the switch 19 outputs a 4-bit DPCM code Yi corresponding to the quantization characteristics of one of the ROM-I 16, the ROM-II 17, and the ROM-III 18. The DPCM code Yi is input to the sync affix circuit 12. An 8-bit local decoded value corresponding to the quantization and inverse quantization characteristics of one of the ROM-I 16, the ROM-II 17, and the ROM-III 18 is input to the D flip-flop 14. An output from the D flip-flop 14 is input to the ROM-I 16, the ROM-II 17, and the ROM-III 18 as the predictive value of the next sample value.

Figure 5:
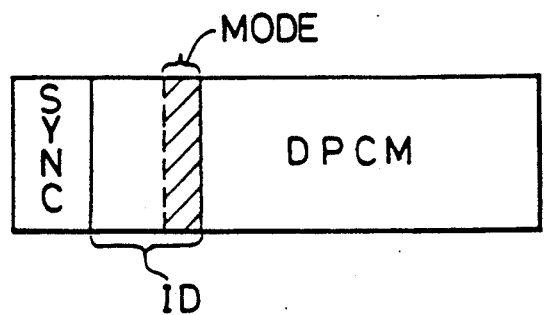
FIG. 5 is a diagram showing the format of data transmitted by the device shown in FIG. 4.

The sync affix circuit 12 adds sync data and ID data including output information (to be referred to as mode information) from the keyboard 23 to a plurality of DPCM codes. FIG. 5 shows a data structure of a one-sync block output from the sync affix circuit 12 shown in FIG. 1. The data format consists of sync data SYNC, ID data ID, mode data MODE in the ID data, and a plurality of DPCM codes DPCM.

Figure 6:
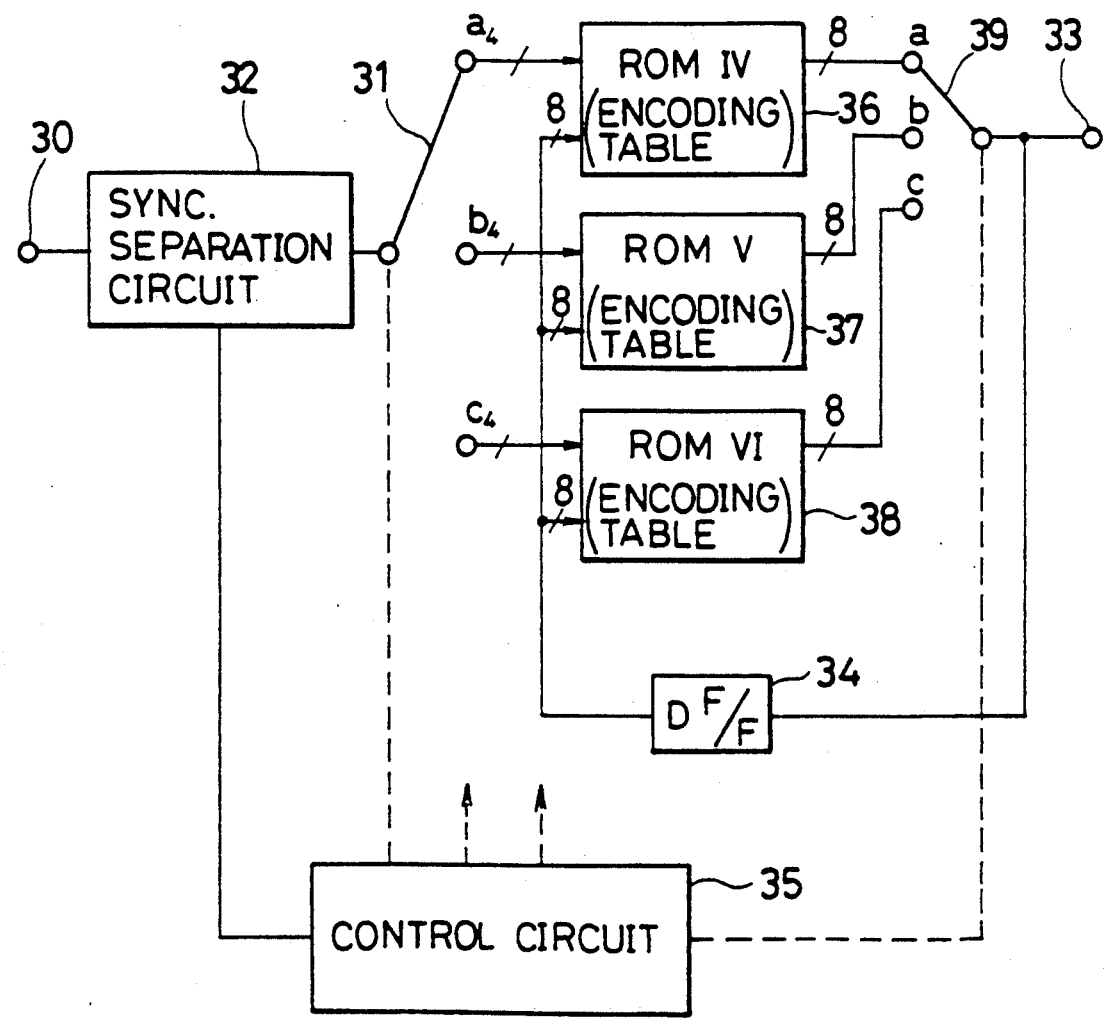
FIG. 6 is a block diagram showing an arrangement of a decoding device corresponding to the coding device shown in FIG. 4.

In this manner, data sequences each having the data format shown in FIG. 6 are sequentially output from the output terminal 13.

FIG. 6 is a block diagram of a decoding device corresponding to the DPCM coding device shown in FIG. 4.

This decoding device includes an input terminal 30 for receiving the data sequence including the DPCM codes, a sync separation circuit 32 for separating sync data and ID data from the data sequence from the terminal 30, a control circuit 35 for controlling the timings of sync and ID data input from the sync separation circuit 32 and the operation timings of switches 31 and 39, a D flip-flop 34 for obtaining the next predictive value from a decoded value output through the switch 39, ROMs (ROM-IV, ROM-V, and ROM-VI) 36, 37, and 38 serving as decoding tables having different inverse quantization characteristics, and an output terminal 33 for outputting the selected decoded value.

The ROM-IV 36, the ROM-V 37, and the ROM-VI 38 serve the function indicated by the portion 9a shown in FIG. 1 and have different decoding characteristics of the inverse quantizer 4. The ROM-IV 36, the ROM-V 37, and the ROM-VI 38 have the same inverse quantization characteristics as the ROM-I 16, the ROM-II 17, and the ROM-III 18, respectively.

The sync and ID data separated by the sync separation circuit 32 are input to the control circuit 35. The control circuit 35 determines the timings of the respective components and controls the switches 31 and 39 in accordance with the mode data included in the ID data. If the decoding table corresponding to the DPCM table selected by the coding device is the ROM-IV 36, the switch 31 is connected to the a terminal, and the DPCM code separated by the sync separation circuit 32 is input to the ROM-VI 36. The decoded value output from the ROM-VI 36 appears at the a terminal of the switch 39. In this manner, the switches 31 and 39 are controlled in accordance with the mode data. A decoded value $\overline{X}i$ appears from the switch 19 in accordance with the inverse quantization characteristics of one of the ROM-IV 36, the ROM-V 37, and the ROM-VI 38. The decoded value $\overline{X}i$ appears at the terminal 33. The decoded value is also input to the D flip-flop 34. An output from the D flip-flop 34 is input to the ROM-VI 36, the ROM-V 37, and the ROM-VI 38 as a predictive value of the next DPCM code.

According to the coding and decoding devices described above, the three types of quantization characteristics can be prepared during DPCM coding. A desired DPCM table can be selected in accordance with the type of information to be transmitted, thereby minimizing the quantization error.

In the coding device described above, the portion indicated by the broken line 9 in FIG. 1 is replaced with one ROM. However, it is possible to series-connect a ROM having the same function as a portion 9b indicated by the alternate long and short dashed line and a ROM having the same function as the portion 9a. With this arrangement, the ROM having the function of the portion 9a can also serve as the ROM used in the decoding device, thereby facilitating mass production.

In the above embodiment, the operator selects a desired DPCM table. However, it is possible to automatically select an appropriate DPCM table upon determination of the nature of the information. For example, when image information is transmitted, the quantization characteristics of the pixel of the present frame are determined in accordance with the pixel of the previous frame at the identical position, thereby achieving coding having a minimum quantization error. In this case, the quantization characteristics are selected in units of sync blocks, and the selected information must be included in the ID data in each sync block.

As described above, in the coding and decoding devices of the above embodiment, coding and decoding can be performed at a high speed, and the quantization error can be minimized.

Figure 7:
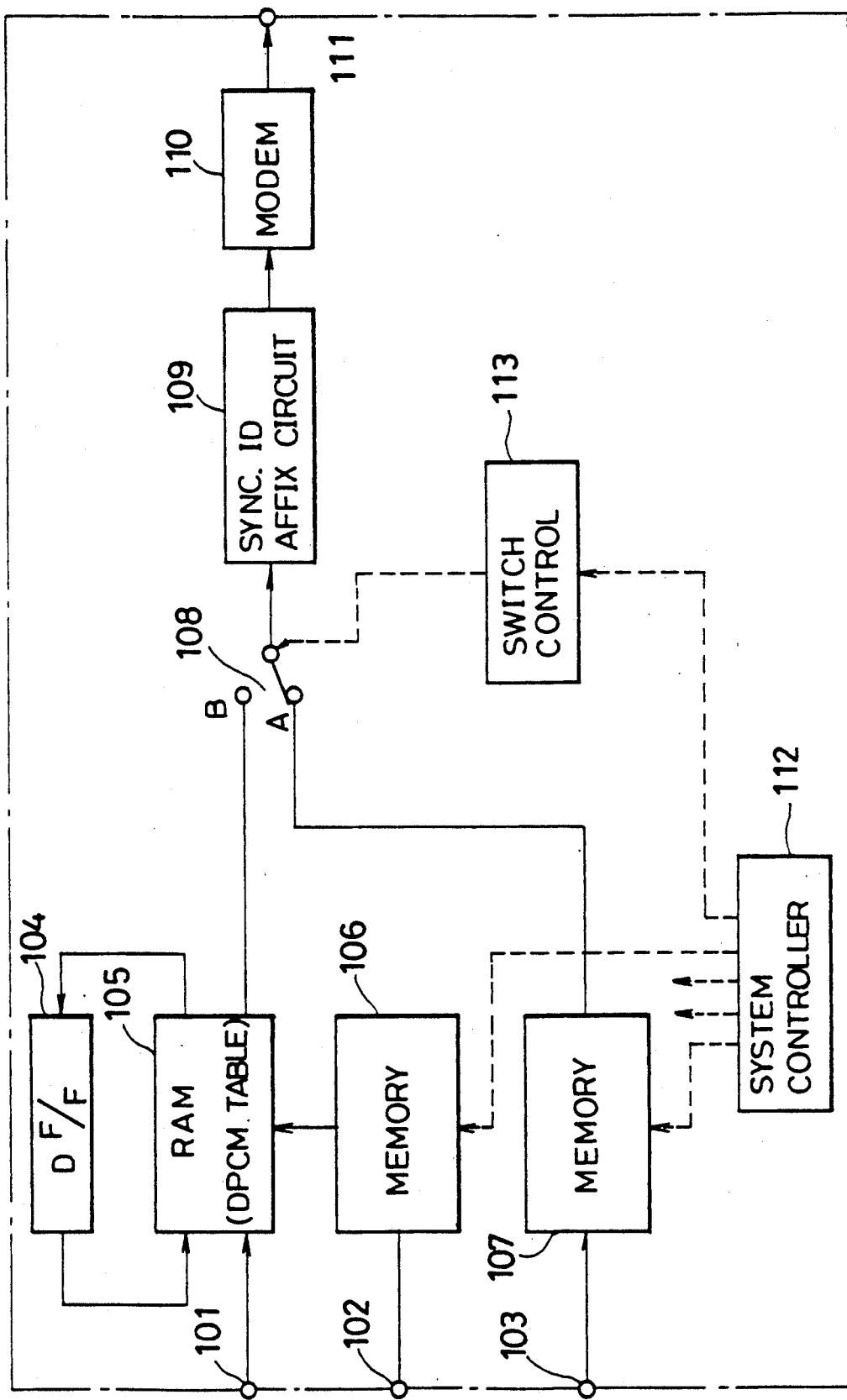
FIG. 7 is a block diagram showing an arrangement of a coding device according to another embodiment of the present invention.
Figure 8:
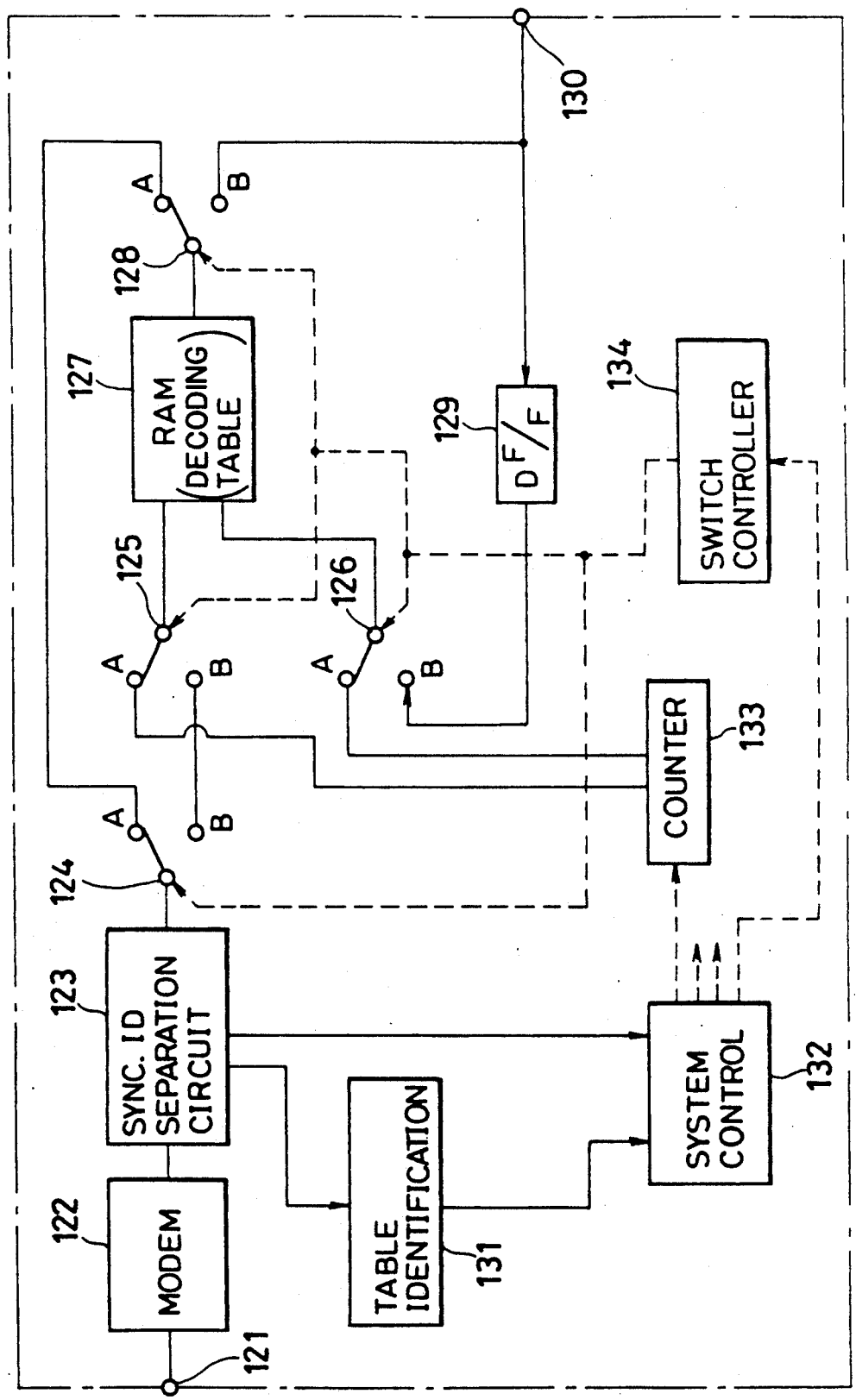
FIG. 8 is a block diagram showing an arrangement of a decoding device corresponding to the coding device shown in FIG. 7.

FIGS. 7 and 8 are block diagrams showing main parts of a coding device and a decoding device, respectively, according to another embodiment of the present invention. When a power switch is turned on, a load signal is supplied from a system controller 112 to a memory 106. Table data consisting of a predetermined DPCM coded code and a local decoded value are stored in the memory 106 through a terminal 102. DPCM tables including the DPCM coded codes and local decoded values are sequentially loaded from the memory 106 to a random access memory (RAM) 105.

The same coded value as the local decoded value is stored in a memory 107 through a terminal 103 beforehand. When the power switch is turned on, a load signal is supplied from the system controller 112 to the memory 107 and the memory 107 then sequentially outputs tables including the DPCM decoded values. The table including the DPCM decoded value consists of the same data as the local decoded value corresponding to the DPCM coded code on the coding device and is for decoding DPCM codes at a decoding device to be described later.

A switch control 113 switches a switch 108 when the coding device is set in a table transmission mode (the second mode) in accordance with the system controller 112. The table including the DPCM decoded value is supplied to a sync.ID affix circuit 109 through the A terminal of the switch 108. The circuit 109 adds the sync data and the ID data and outputs data having a format shown in FIG. 9B. The circuit 109 adds to the ID data an identification code representing that data to be transmitted is table data or a DPCM code. The data string output from the sync.ID affix circuit 109 is supplied to a modem 110 and is transmitted onto a transmission line (not shown) through an output terminal 111.

In the decoding device shown in FIG. 8, the data string is decoded through an input terminal 121 and a modem 122 and is supplied to a sync ID separation circuit 123, thereby separating the sync and ID data. The sync data in the data string having the format shown in FIG. 9B is directly supplied to a system controller 132, and all the operation timings of the decoding device are determined. The identification code in the ID data is supplied to a table identification circuit 131. The table identification circuit 131 identifies that the transmitted data is table data or a predictive coded code. An output from the table identification circuit 131 is supplied to the system controller 132 to control the operation of a switch controller 134 in accordance with the identification code. Switches 124, 125, 126, and 128 are operated under the control of the switch controller 134. As a result, a table data write mode (the second mode) is set.

When the table identification circuit 131 determines that the input data is decoding table data, all the switches 124, 125, 126, and 128 are connected to the A terminals, respectively.

At this time, address control data for loading the table data is supplied from a counter 133 to the address inputs of a RAM 127 through the A terminals of the switches 125 and 126. The counter 133 is sequentially counted up at timings determined on the basis of the sync data input to the system controller 132, thereby generating the address control data for the RAM 127.

In this manner, the decoding table corresponding to the table written in the RAM 105 of FIG. 7 is stored in the RAM 127 of the decoding device shown in FIG. 8.

An information data transmission mode (the first mode) will be described below.

Figure 2:
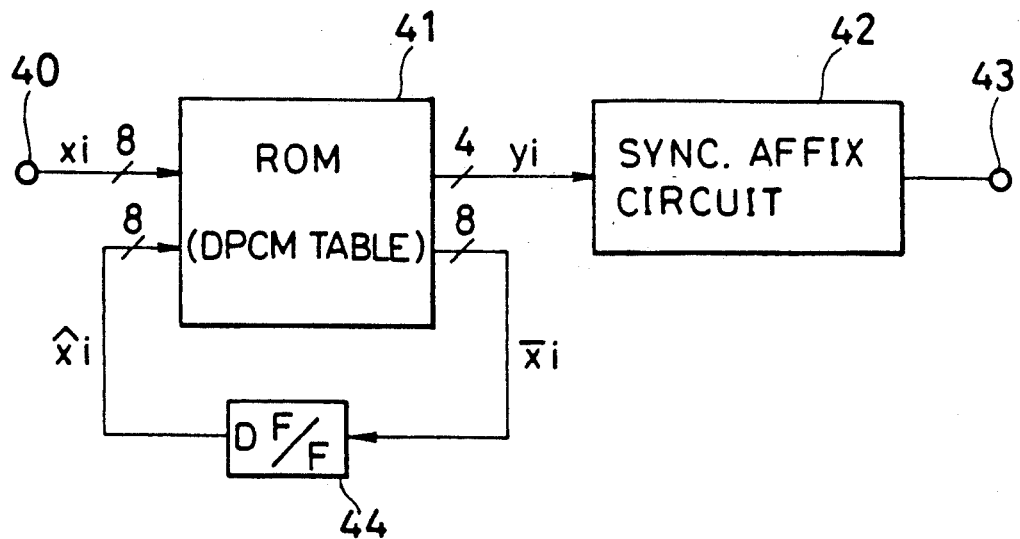
FIG. 2 is a block diagram showing a conventional DPCM coding device using a read-only memory.
Figure 3:
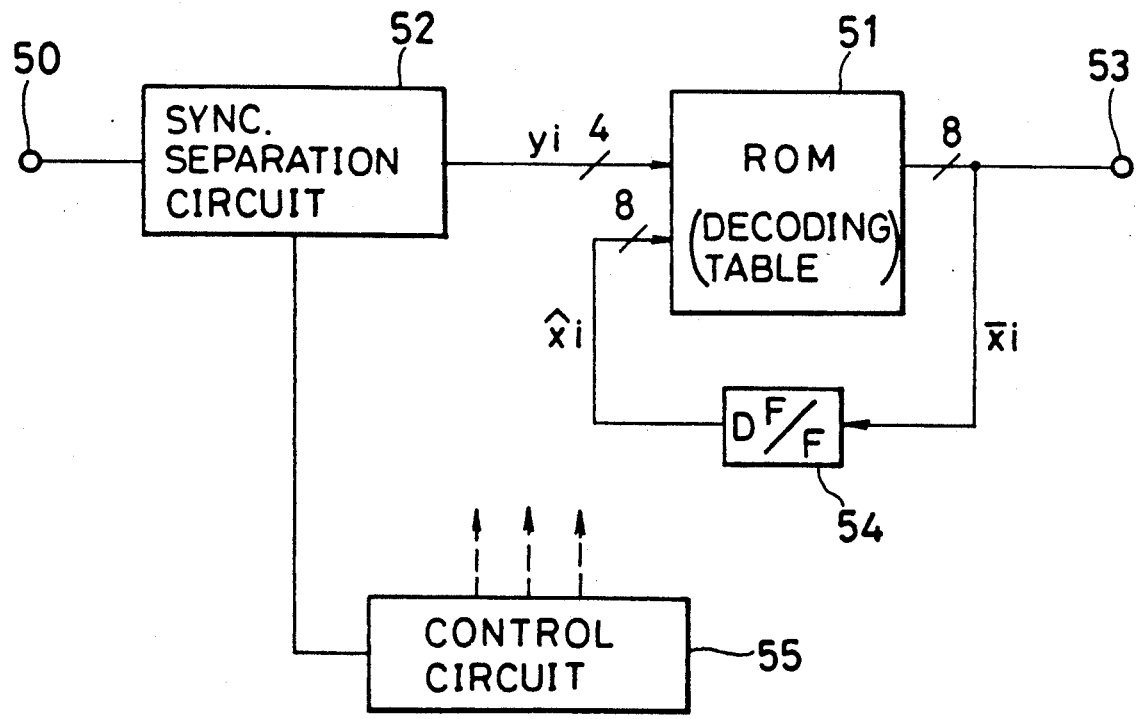
FIG. 3 is a block diagram of a conventional decoding device corresponding to the coding device shown in FIG. 2.

An input sample value from an input terminal 101 and a predictive value from the D flip-flop 104 are input to the RAM 105 as read address control data in FIG. 7. The RAM 105 stores the sample value, the DPCM code, and the local decoded value in the previous step, the latter two data are based on the predictive value. The DPCM code and the local decoded value are read out in parallel. The DPCM code is input to the sync ID affix circuit 109 through the switch 108 connected to the B side by the switch control 113, and the local decoded value is input to the D flip-flop 104. That is, the RAM 105 in FIG. 7 has the same function as the ROM 41 of FIG. 2.

The sync ID affix circuit 109 adds the sync data and the ID data to this DPCM code to obtain a data string having the format shown in FIG. 9A. In this case, the identification code in the ID data represents that the data to be transmitted represents a DPCM code. The data string output from the circuit 109 is transmitted onto the transmission line through the modem 110 and the terminal 111 in the same manner as in table data transmission.

In the decoding device shown in FIG. 8, when the table identification circuit 131 identifies on the basis of the identification code separated by the sync.ID separation circuit 123 that the DPCM code is input, the system controller 132 sends a command to the switch controller 134 to connect the switches 124, 125, 126, and 128 to the corresponding B terminals.

The DPCM code output from the sync ID separation circuit 123 designates a read address of the RAM 127 through the A terminals of the switches 124 and 125. The decoding table corresponding to the processing of the RAM 105 on the transmission side is written in the RAM 127 in the previous step. Processing corresponding to the portion 9a in FIG. 1 is performed, and the decoded value is output to the output terminal 130 through the B terminal of the switch 128. This decoded value is delayed by a D flip-flop 129, and the delayed value serves as the next predictive value. This value designates the read address of the RAM 127 together with the DPCM code through the B terminal of the switch 126.

With the above arrangement, the decoding device can always decode the coded value although the coding device performs predictive coding in accordance with any of the quantization characteristics. Therefore, optimal quantization characteristics can be set in the coding device in accordance with the nature of the information to be transmitted.

Even during the operation of the coding and decoding devices, a new table can be written in the memories 106 and 107 and is loaded in the RAM 105 of the coding device and the RAM 127 of the decoding device. Therefore, the quantization characteristics can be arbitrarily changed.

The memories 106 and 107 in FIG. 7 may have a long access time if they have a capacity for storing prescribed DPCM tables. Each of the memories 106 and 107 may comprise a semiconductor memory (e.g., an EPROM) or a magnetic recording/reproducing apparatus (e.g., a magnetic disk unit).

FIG. 10 is a block diagram showing a coding device according to still another embodiment of the present invention. The same reference numerals as in FIG. 7 denote the same parts in FIG. 10, and a detailed description thereof will be omitted. In the coding device shown in FIG. 10, the memories 106 and 107 are replaced with one memory 152.

Loading of tables in the RAMs of the coding and decoding devices will be described below.

Data serving as a table including a DPCM code and a decoded value (local decoded value) for the RAM 105 is prestored in the memory 152 through a terminal 150. When a power switch is turned on, a system controller 153 sends a command to a switch controller 154, and the switch controller 154 connects a switch 151 to the X side. The table consisting of the DPCM code and the local decoded value is loaded from the memory 152 to the RAM 105 through the X side of the switch 151. When loading of the table into the RAM 105 is completed, the system controller 153 causes the switch controller 154 to set the switch 151 to the Y side. The table consisting of the decoded value is supplied from the memory 152 to a sync ID affix circuit 109 through the A side of the Y-side switch 108 of the switch 151. The decoded value is transmitted and loaded in the RAM 127 in the same manner as in the coding device shown in FIG. 7.

With the above arrangement, the periods required for loading the tables in the RAMs 105 and 127 are increased, but the memory capacity can be reduced, thereby obtaining an inexpensive system.

FIG. 11 is a block diagram showing an arrangement of a coding device according to still another embodiment of the present invention. The same reference numerals as in FIG. 10 denote the same parts in FIG. 11, and a detailed description thereof will be omitted.

In the embodiment shown in FIG. 11, RAMs 160 and 161 are respectively connected to the output sides of the X and Y terminals of the switch 151 shown in FIG. 10. The coding and decoding tables temporarily stored in the memory 152 are not directly loaded in the RAMs 105 and 127, but are written in the RAMs 160 and 161.

When a table update command is output from a system controller 158, tables are simultaneously output from the RAMs 160 and 161 and loaded in the RAMs 105 and 127.

With the above arrangement, even if one memory having a low access speed is used, the tables can be loaded from the RAMs 160 and 161 to the RAMs 105 and 127 within a very short period of time. When quantization characteristics are to be changed at the time of changes in program of the information to be transmitted, the dead time can be minimized.

In the coding and decoding devices of each embodiment described above, if the input/output characteristics are known in coding calculations, the circuit arrangement need not be changed for complicated algorithms as long as the number of input bits is equal to the number of output bits. The table is constituted by an SRAM, so that the algorithm can be easily changed. When a magnetic disk unit is used as a memory, the algorithm can be changed by simply changing a disk. In addition, since the access time of the memory can be prolonged, inexpensive large-capacity memories such as a magnetic disk unit can be used to set a large number of algorithms.

The table having the same function as the portion 9 indicated by the broken line in FIG. 1 is loaded in the RAM of the coding device which serves as the look-up table in each embodiment described above. However, it is possible to series-connect the RAM corresponding to the portion 9a indicated by the alternate long and short dashed line and the RAM corresponding to the portion 9b indicated by the alternate long and short dashed line, and to load the tables in the corresponding tables.

In each embodiment described above, the previous predictive DPCM is exemplified. However, the present invention is not limited to this predictive technique, but, the present invention can also be applied to a coding system using a DPCM for performing two-dimensional, three-dimensional, and adaptive prediction operations, and a decoding system corresponding to this coding system. In addition, the present invention is further applicable to a coding system for determining an arbitrary code length except for the above examples, and a decoding system corresponding to this coding system.

In addition, in each embodiment described above, an SRAM is used as the RAM. However, if the refresh and cycle time conditions are satisfied, a DRAM may be used in place of an SRAM.

As has been described above, according to the present invention, there are provided a coding device which can always be set with optimal predictive coding characteristics and a decoding device capable of decoding the code coded by arbitrary predictive coding characteristics.

What is claimed is:

1. A predictive coding device, comprising:
   (a) input means for inputting a sampled value;
   (b) predictive means for generating a predictive value for the sampled value;
   (c) a plurality of means for storing look-up tables, each of which receives the sampled value and a corresponding predictive value as address data and outputs coded codes corresponding thereto;
   (d) switching means for selectively outputting the coded codes outputted from said plurality of means for storing the look-up tables;
   (e) generating means for generating a selection code which indicates a selection operation of said switching means; and
   (f) transmitting means for transmitting the coded codes outputted by said switching means and the selection code generated by said generating means.

2. A device according to claim 1, further comprising manually operable means for designating the selection operation of said switching means, and wherein said generating means generates the selection code in response to an operation of said manually operable means.

3. A device according to claim 2, wherein each of said plurality of means for storing the look-up tables further outputs a local decoded value, said predictive means includes a switching circuit for selectively outputting the local decoded values outputted from said plurality of means for storing the look-up tables in response to an operation of said manually operable means and a predictive circuit for generating the predictive value by using the local decoded values outputted by said switching circuit.

4. A device according to claim 1, wherein said transmitting means multiplexes the coded code, sync pattern data, and the selection code along a time axis, and transmits the multiplexed data.

5. A device according to claim 4, wherein said transmitting means transmits data in units of sync blocks which include the sync pattern data at the start thereof, the coded code, and the selection code.

6. A predictive coding device, comprising:
   (a) input means for inputting a sampled value;
   (b) predictive means for generating a predictive value for the sampled value;
   (c) means for storing a look-up table which receives the sampled value and a corresponding predictive value as address data and outputs a coded code corresponding thereto, said means for storing the look-up table including a random access memory which outputs the coded code;
   (d) writing means for writing and storing the coded code in said random access memory, said writing means being able to update the coded code stored in said random access memory;
   (e) generating means for generating decoded values which correspond to the coded code stored in said random access memory; and
   (f) transmitting means for transmitting the coded code outputted by said random access memory in a normal transmission mode, and transmitting the decoded values generated by said generating means in a table transmission mode.

7. A device according to claim 6, wherein said means for storing the look-up table further outputs a local decoded value corresponding to the coded code outputted therefrom, and wherein said predictive means generates the predictive value by using the local decoded value outputted by said means for storing the look-up table.

8. A device according to claim 7, wherein said writing means further writes local decoded values corresponding to the decoded values generated by said generating means in said random access memory.

9. A device according to claim 7, wherein said writing means includes a first memory which stores the coded code and the local decoded value, and wherein said generating means includes a second memory which stores a decoded value corresponding to the local decode value.

10. A device according to claim 7, wherein said writing means includes a memory which stores the coded code and the local decoded value, and wherein said generating means includes a circuit for retrieving the local decoded value as the decoded values.

11. A device according to claim 6, wherein said transmitting means transmits data in units of sync blocks each block including sync pattern data at the start thereof, and one of the coded code outputted by said means for storing the look-up table and the decoded value generated by said generating means.

12. A predictive coding device, comprising:
   (a) input means for inputting a sampled value;
   (b) a plurality of means for storing look-up tables each of which receives the sampled value and a corresponding predictive value as address data and outputs a coded code and a local decoded value corresponding thereto;
   (c) first switching means for selectively outputting the coded codes outputted from said plurality of means for storing the look-up tables;
   (d) transmitting means for transmitting a coded code outputted by said first switching means;
   (e) second switching means for selectively outputting the local decoded values outputted from said plurality of means for storing the look-up tables; and (f) predictive means for generating a predictive value for the sampled value by using a local decoded value outputted by said second switching means.

13. A device according to claim 12, further comprising generating means for generating a selection code which indicates a selecting operation to be performed by said first and second switching means, and wherein said transmitting means further transmits the selection code with the coded code.

14. A predictive decoding device, comprising:
(a) input means for inputting a coded code obtained by coding a differential value between a sampled value and a corresponding predictive value and a selection code;
(b) a plurality of means for storing look-up tables each of which receives the coded code and a predictive value as address data and outputs a decoded value corresponding thereto;
(c) switching means for selectively outputting the decoded values outputted by said plurality of means for storing the look-up tables in response to receiving the selection code; and
(d) predictive means for generating the predictive value by using a decoded value outputted by said switching means.

15. A device according to claim 14, wherein said input means includes a separation circuit for separating the coded code and the selection code from multiplexed data of sync pattern data, coded codes, and the selection codes.

16. A predictive decoding device, comprising:
(a) input means for inputting a coded code obtained by coding a differential value between a sample value and a corresponding predictive value in a normal input mode, and for inputting decoded values in a table input mode;
(b) means for storing a look-up table which receives the coded code and the predictive value as address data and outputs a decoded value corresponding thereto, said means for storing the look-up table including a random access memory;
(c) writing means for writing the decoded values inputted by said input means in said random access memory, said writing means being able to update the decoded values stored in said random access memory; and
(d) predictive means for generating the predictive value for the sampled value by using the decoded value outputted from said means for storing the look up table.

* * * * *

UNITED STATES PATENT AND TRADEMARK OFFICE
CERTIFICATE OF CORRECTION

PATENT NO. : 5,043,728
DATED : August 27, 1991
INVENTOR(S) : NOBUHIRO HOSHI, ET AL.

It is certified that error appears in the above-identified patent and that said Letters Patent is hereby corrected as shown below:

COLUMN 1

Line 22, "the" should read --the difference--.
Line 35, "is-" should read --is--.

COLUMN 5

Line 20, "the timings" should read
--the operation timings--.

COLUMN 6

Line 30, "sync.ID" should read --sync ID--.
Line 36, "sync.ID" should read --sync ID--.

COLUMN 7

Line 30, "sync.ID" should read --sync ID--.

COLUMN 10

Line 51, "code" should read --codes--.

Signed and Sealed this

Twenty-ninth Day of June, 1993

Attest:

MICHAEL K. KIRK

Attesting Officer

Acting Commissioner of Patents and Trademarks